(12) United States Patent
Ries et al.

(10) Patent No.: US 8,859,393 B2
(45) Date of Patent: Oct. 14, 2014

(54) METHODS FOR IN-SITU PASSIVATION OF SILICON-ON-INSULATOR WAFERS

(75) Inventors: Michael J. Ries, St. Charles, MO (US); Dale A. Witte, Wentzville, MO (US); Anca Stefanescu, St. Charles, MO (US); Andrew M. Jones, Wildwood, MO (US)

(73) Assignee: SunEdison Semiconductor Limited, St. Peters, MO (US)

( * ) Notice: Subject to any disclaimer, the term of this patent is extended or adjusted under 35 U.S.C. 154(b) by 502 days.

(21) Appl. No.: 13/162,122

(22) Filed: Jun. 16, 2011

(65) Prior Publication Data

US 2012/0003814 A1 Jan. 5, 2012

Related U.S. Application Data

(60) Provisional application No. 61/359,998, filed on Jun. 30, 2010.

(51) Int. Cl.
*H01L 21/30* (2006.01)
*H01L 21/46* (2006.01)
*H01L 21/762* (2006.01)

(52) U.S. Cl.
CPC ............... *H01L 21/76254* (2013.01)
USPC .................. 438/458; 257/E21.568

(58) Field of Classification Search
USPC ................................. 438/458, 479
See application file for complete search history.

(56) References Cited

U.S. PATENT DOCUMENTS

| 5,880,029 | A | * | 3/1999 | Eisenbeiser et al. | 438/694 |
| 5,972,802 | A | * | 10/1999 | Nakano et al. | 438/770 |
| 2002/0175143 | A1 | * | 11/2002 | Cooper | 216/38 |
| 2004/0077184 | A1 | | 4/2004 | Anderson et al. | |
| 2004/0242002 | A1 | | 12/2004 | Okawa | |
| 2007/0184631 | A1 | | 8/2007 | Nakamura et al. | |
| 2010/0096720 | A1 | | 4/2010 | Ohnuma et al. | |
| 2010/0130021 | A1 | | 5/2010 | Ries et al. | |

FOREIGN PATENT DOCUMENTS

| CN | 1574233 A | 2/2005 |
| EP | 1791175 A2 | 5/2007 |
| GB | 1444588 | 8/1976 |
| JP | 2007149723 A | 6/2007 |

OTHER PUBLICATIONS

PCT International Search Report and Written Opinion of the international Searching Authority mailed on Dec. 27, 2011 regarding PCT/IB2011/052903: 8 pages.

\* cited by examiner

*Primary Examiner* — Calvin Choi
(74) *Attorney, Agent, or Firm* — Armstrong Teasdale LLP

(57) ABSTRACT

Methods and systems are disclosed for performing a passivation process on a silicon-on-insulator wafer in a chamber in which the wafer is cleaved. A bonded wafer pair is cleaved within the chamber to form the silicon-on-insulator (SOI) wafer. A cleaved surface of the SOI wafer is then passivated in-situ by exposing the cleaved surface to a passivating substance. This exposure to a passivating substance results in the formation of a thin layer of oxide on the cleaved surface. The silicon-on-insulator wafer is then removed from the chamber. In other embodiments, the silicon-on-insulator wafer is first transferred to an adjoining chamber where the wafer is then passivated. The wafer is transferred to the adjoining chamber without exposing the wafer to the atmosphere outside the chambers.

5 Claims, 8 Drawing Sheets

US 8,859,393 B2

METHODS FOR IN-SITU PASSIVATION OF SILICON-ON-INSULATOR WAFERS

CROSS-REFERENCE TO RELATED APPLICATION

This application claims priority to U.S. Provisional Application No. 61/359,998 filed Jun. 30, 2010, the entire disclosure of which is hereby incorporated by reference in its entirety.

BACKGROUND

Semiconductor wafers are generally prepared from a single crystal ingot (e.g., a silicon ingot) which is then sliced into individual wafers. One type of wafer is a silicon-on-insulator (SOI) wafer. An SOI wafer includes a thin layer of silicon atop an insulating layer (i.e., an oxide layer) which is in turn disposed on a silicon substrate. The SOI wafer is formed by bonding a pair of wafers together and later removing a portion of one of the wafers in a cleaving operation.

An outer (i.e., cleaved) surface of the SOI wafer is often contaminated by contact with or exposure to a variety of materials after removal from a chamber in which the SOI wafer is formed. Once contaminated, cleaning the cleaved surface of the SOI wafer is difficult, time-consuming, costly, and often times not entirely successful. Accordingly, there remains an unfulfilled need for a process that protects the cleaved surface of the SOI wafer from contamination.

BRIEF SUMMARY

One aspect is a method for performing a passivation process on a silicon-on-insulator wafer in a chamber. The method comprises the steps of cleaving a bonded wafer pair within the chamber to form the silicon-on-insulator (SOI) wafer, the SOI wafer having a cleaved surface. The cleaved surface of the SOI wafer is then passivated in-situ by exposing the cleaved surface to a gaseous form of ozone, wherein exposing the cleaved surface to the gaseous form of ozone results in a thin layer of oxide on the cleaved surface. The silicon-on-insulator wafer is then removed from the chamber.

Another aspect is a method for performing a passivation process on a silicon-on-insulator wafer in a chamber in which a bonded wafer pair is cleaved to form the silicon-on-insulator wafer. The method comprises the steps of cleaving the bonded wafer pair within the chamber to form the silicon-on-insulator wafer, wherein cleaving the bonded wafer pair forms a cleaved surface on the silicon-on-insulator wafer. A passivation process is then performed on the cleaved surface of the silicon-on-insulator wafer in-situ to form a thin layer of oxide on the cleaved surface. The silicon-on-insulator wafer is then removed from the chamber.

Still another aspect is a method of performing a passivation process on a layered silicon structure in a second chamber adjoining a first chamber in which the layered silicon structure is formed. The method comprises the steps of forming the layered silicon structure in the first chamber, the layered structure having a surface. The layered silicon structure is then transferred from the first chamber to the second chamber without exposing the layered silicon structure to atmosphere outside the chambers. A passivation process is then performed on the surface of the layered silicon structure. The layered silicon structure is then removed from the second chamber.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

DETAILED DESCRIPTION

Figure 1:
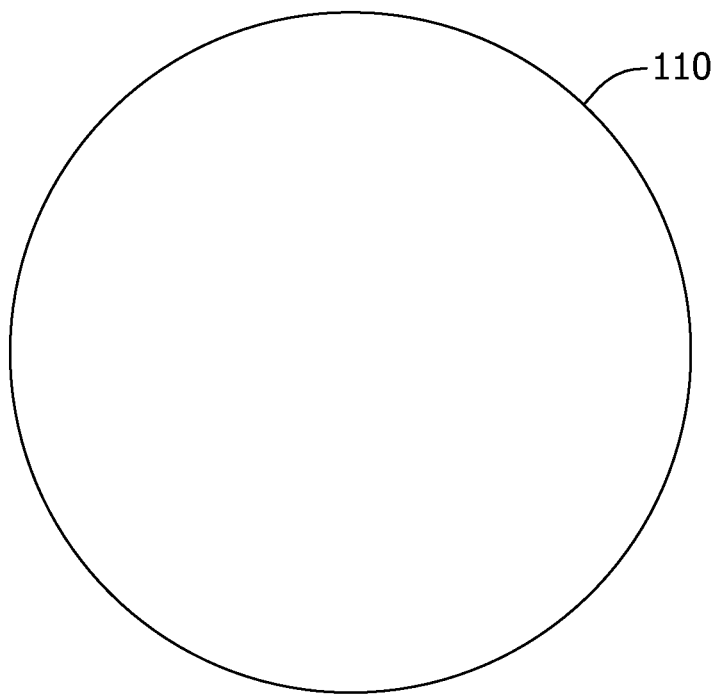
FIG. 1 is a top plan view of a donor silicon wafer.
Figure 2:
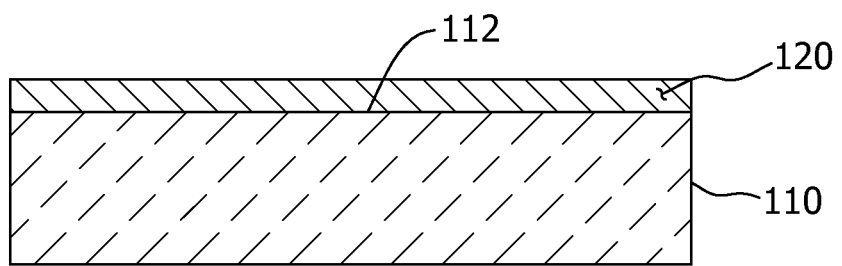
FIG. 2 is a cross-sectional view of the donor silicon wafer of FIG. 1B.

Referring initially to FIGS. 1 and 2, a donor wafer 110 and an oxide layer 120 of one embodiment of this disclosure are shown. FIG. 1 is a top plan view of the donor wafer 110, while FIG. 2 is a cross-sectional view of the donor wafer. The oxide layer 120 is bonded to a front surface 112 of the donor wafer 110. The oxide layer 120 can be grown atop the front surface 112 by subjecting the donor wafer 110 to an atmosphere suitable for the growth of the oxide layer. Alternatively, the oxide layer 120 can be deposited on the front surface 112 through any known chemical deposition process and functions as an insulator (i.e., a dielectric).

Figure 3:
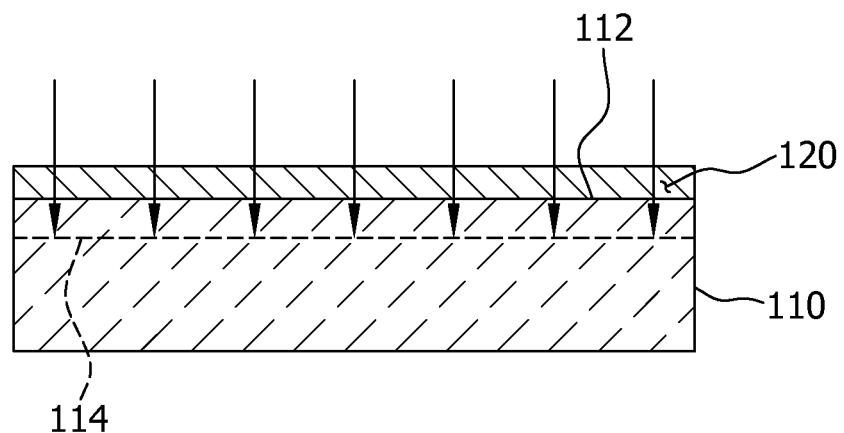
FIG. 3 is a cross-sectional view of the donor silicon wafer undergoing ion implantation.

FIG. 3 is a cross-sectional view of the donor wafer 110 being implanted with particles (e.g., hydrogen atoms or a combination of both hydrogen atoms and helium atoms). The donor wafer 110 is implanted with particles to a specified depth below the front surface 112 of the donor wafer 110. In some embodiments, the particles are hydrogen or helium ions which are implanted through an ion implantation process. A cleave plane 114 is then formed beneath the front surface 112 of the donor wafer 120 at a distance from the front surface equal to specified depth to which the particles were implanted. The cleave plane 114 defines a plane through the donor wafer 110 where the donor wafer is substantially weakened by the implantation of the ions and upon subsequent heating of the donor wafer.

Figure 4:
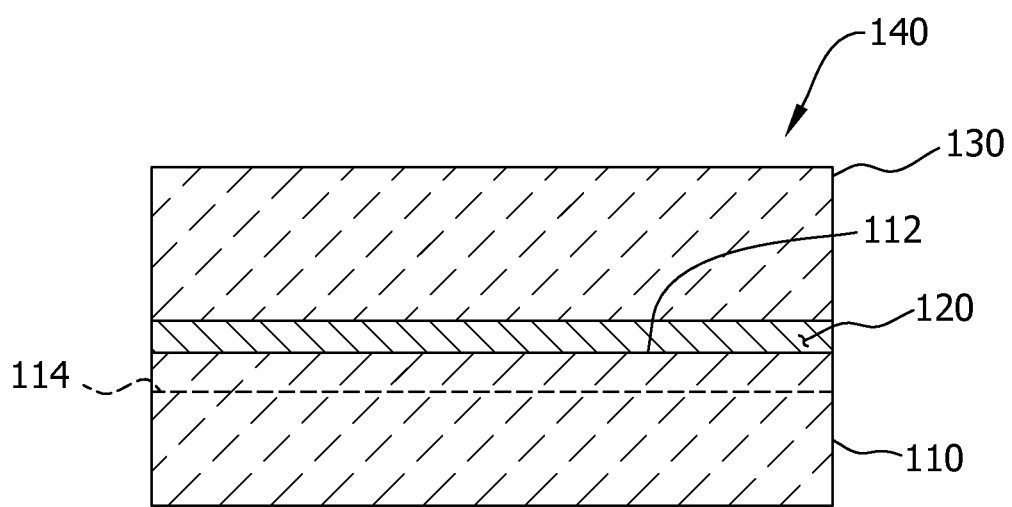
FIG. 4 is a cross-sectional view of a bonded wafer comprising the donor silicon wafer bonded to a handle silicon wafer.

FIG. 4 is a cross-sectional view of the donor wafer 110 and a handle wafer 130 bonded together to form a bonded wafer 140. The donor wafer 110 and handle wafer 130 are bonded together in accordance with any suitable method, such as a hydrophilic bond. The donor wafer 110 and handle wafer 130 are bonded together by exposing the surfaces of the wafers to plasma containing, for example, oxygen or nitrogen. The surfaces of the wafers 110, 130 are modified by the exposure to the plasma in a process often referred to as surface activation. The wafers 110, 130 are then pressed together and a bond is formed therebetween. This bond is weak, but the bond is strengthened before the bonded wafer 140 is processed further.

In some processes, the hydrophilic bond between the donor wafer 110 and handle wafer 130 (i.e., the bonded wafer 140) is strengthened by heating or annealing the bonded wafer pair at temperatures between approximately 300° C. and 500° C. The elevated temperatures cause formation of covalent bonds between the adjoining surfaces of the donor wafer 110 and the handle wafer 130, thus solidifying the bond between the donor wafer and the handle wafer. Concurrently with the heating or annealing of the bonded wafer 140, the particles earlier implanted in the donor wafer 110 begin to move and weaken the cleave plane 114.

Figure 5:
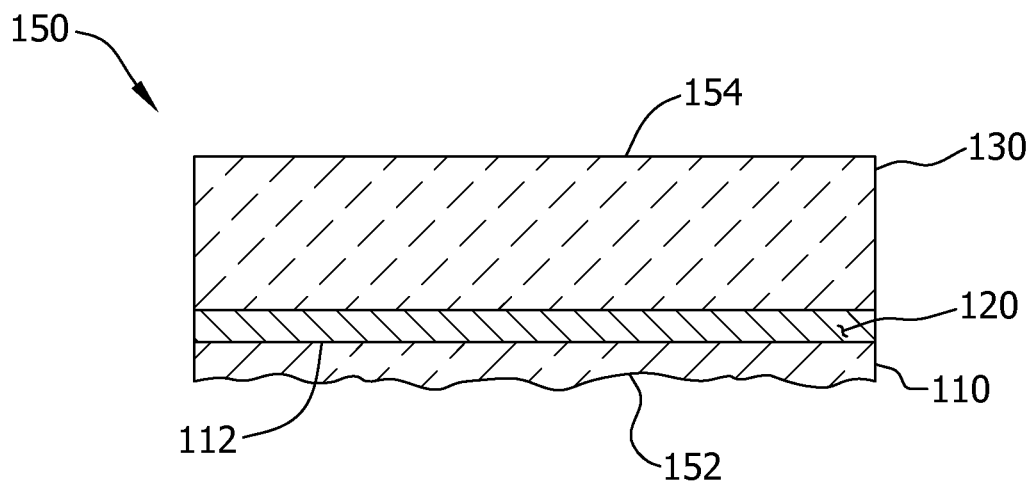
FIG. 5 is a cross-sectional view of the bonded wafer of FIG. 4 after a portion of the donor wafer has been removed to form a silicon-on-insulator wafer.

FIG. 5 is a cross-sectional view of the bonded wafer 140 depicted in FIG. 4 after a portion of the bonded wafer has been removed during a cleaving process, resulting in the creation of a silicon-on-insulator (SOI) wafer, referred to generally as 150. According to other methods, the bonded wafer 140 may instead be subjected to an elevated temperature over a period of time to separate the portion of the donor wafer from the bonded wafer. Exposure to the elevated temperature functions to initiate and then propagate a crack along the cleave plane, thus separating a portion of the donor wafer 110 from the remainder of the donor wafer.

Figure 7:
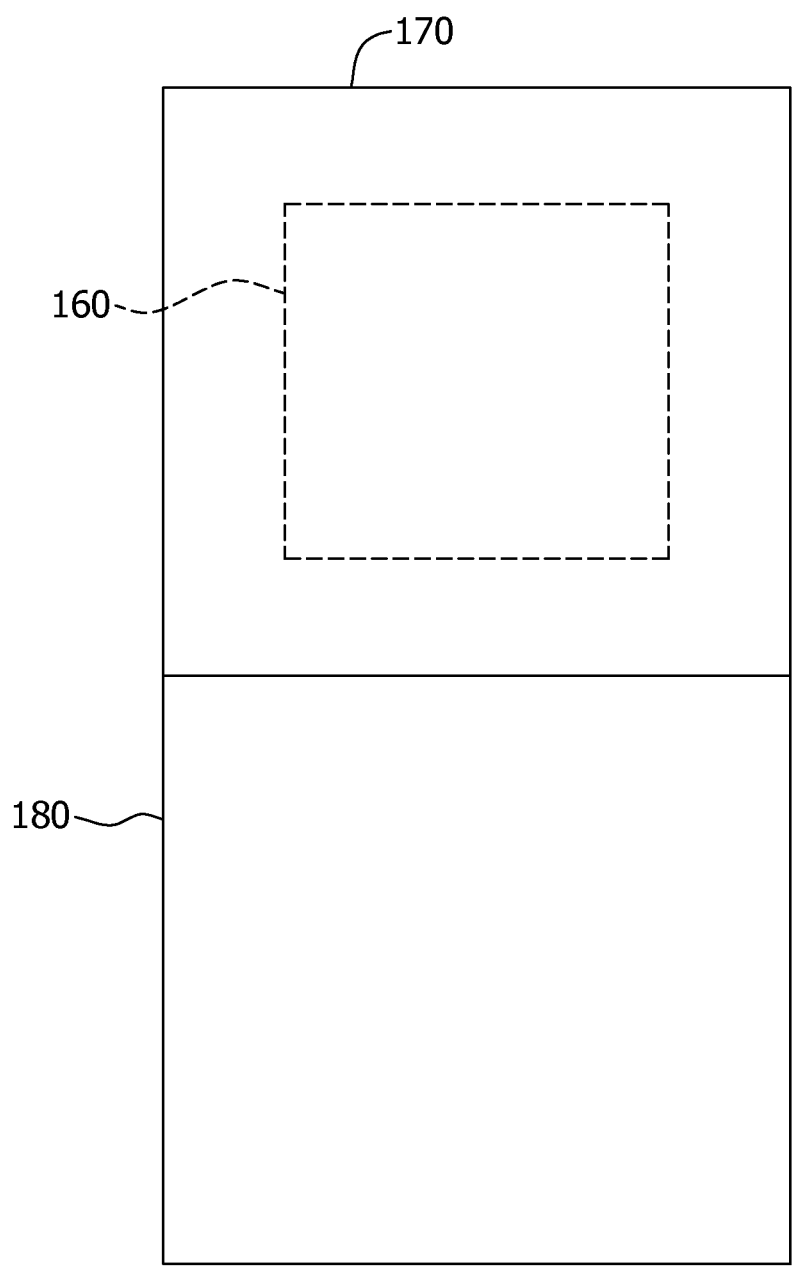
FIG. 7 is a schematic view of a chamber with a fixture disposed therein for cleaving the bonded wafer of FIG. 4.

Because the cleave plane 114 has been substantially weakened by the implantation of ions, it defines a boundary along which the wafer readily separates when a force is applied thereto. According to some embodiments, the bonded wafer 140 is first placed in a fixture (indicated generally in phantom at 160) disposed within a chamber 170, as shown in FIG. 7. The chamber 170 is substantially sealed from the outside environment during cleaving of the bonded wafer 140, and in the exemplary embodiment is filled with an inert gas (e.g., Argon or Nitrogen) prior to the SOI wafer 150 being passivated. In another embodiment, the chamber 170 is not filled with an inert gas and instead is filled with a gas or substance (described in greater detail below) that passivates the surface of the wafer after it is cleaved. Moreover, in some embodiments, the bonded wafer 140 is cleaved in an open-air environment. In this open-air environment, the cleaved surface 152 of the SOI wafer 150 may be exposed to elements commonly found in the atmosphere. The humidity may be increased in this open-air environment to aid in the passivation of the cleaved surface 152 of the SOI wafer 150. In these embodiments, the SOI wafer 150 may be placed in a cassette. The cassette may be capable of holding multiple wafers. This cassette can be purged with nitrogen or other passivating substances (e.g., ozone) to passivate the cleaved surface 152 of the SOI wafer.

The fixture 160 applies mechanical force perpendicular to the opposing sides of the bonded wafer 140 in order to pull the portion of the donor wafer 110 apart from the bonded wafer. In one embodiment, suction cups are used to apply the mechanical force. The separation of the portion of the donor wafer 110 is initiated by applying a mechanical wedge at the edge of the bonded wafer at the cleave plane in order to initiate propagation of a crack along the cleave plane. Due to the weakened structure of the cleave plane, the crack propagates along the cleave plane 114 until the bonded wafer 140 has separated into two pieces along the cleave plane. The mechanical force applied by the suction cups then pulls the bonded wafer 140 into two pieces. One piece is comprised only of a portion of the donor wafer 110. The other piece is comprised of the handle wafer 130 and the portion of the donor wafer 110 bonded thereto and forms the SOI wafer 150.

Figure 6:
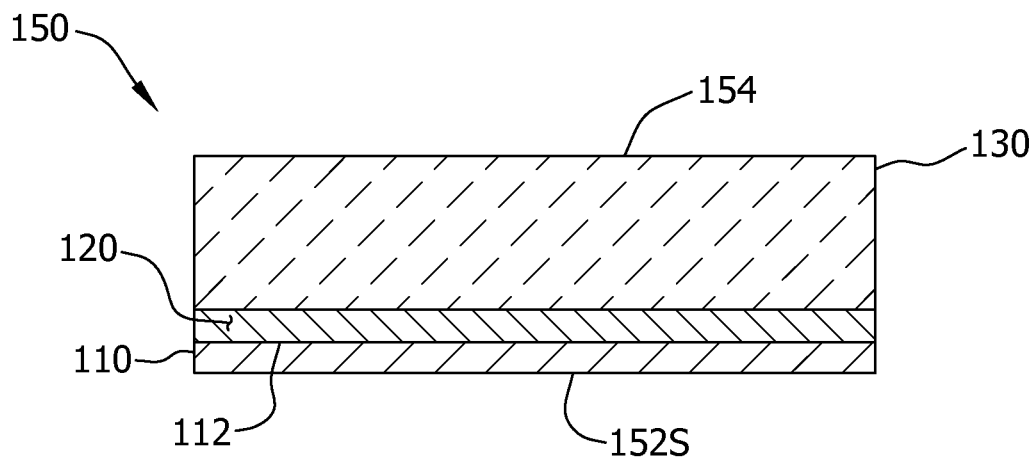
FIG. 6 is a cross-section of the silicon-on-insulator wafer of FIG. 5 after a cleaved surface of the wafer has been smoothed.

A cleaved surface 152 of the SOI wafer 150 defines the surface which results after the separation of the bonded wafer 140 along the cleave plane 114. The cleaved surface 152 has a damaged surface as a result of the separation along the cleave plane 114 that, without further processing, renders the surface ill-suited for end-use applications. Accordingly, the cleaved surface 152 is subjected to additional processing steps to repair the damage and smooth the cleaved surface, resulting in the smooth cleaved surface 152S shown in FIG. 6.

The cleaved surface 152 of the SOI wafer 150 in previous systems was often subject to contamination following the cleaving or removal of the portion of the donor wafer 110. The contamination can originate from a variety of sources, such as a cassette in which the SOI wafer 150 is stored after being cleaved. Sources of contamination can also include contaminants in the atmosphere (e.g., organic compounds, etc.) that the SOI wafer 150 is exposed to after being removed from the chamber 170 and before subsequent processing operations.

Without being bound to any particular theory, it is believed that the affinity for contamination of the cleaved surface 152 is the result of dangling bonds formed in the cleaved surface of the SOI wafer 150 during the cleaving operation. These dangling bonds are believed to be highly chemically reactive, as atoms are removed from molecules in the cleaved surface 152 when the portion of the donor wafer 110 is cleaved from the bonded wafer 140. The dangling bonds react quickly with substances that contact the cleaved surface 152 of the SOI wafer 150, and in particular organic substances (i.e., substances containing Carbon).

Cleaning processes performed on the cleaved surface 152 have been modified in previous systems in order to attempt to remove the contamination on the cleaved surface. However, these cleaning processes have not been entirely successful. Other attempts to remove the contamination from the cleaved surface 152 of the SOI wafers 150 have focused on elimination of the sources of contamination by improving the cleanliness of the environment within the chamber 170 or replacing the cassettes in which the SOI wafers 150 are stored. These attempts have likewise yielded unsatisfactory results, as there are many potential sources of contamination and the cleaved surface 152 is believed to have a strong affinity for reacting with contaminants.

Accordingly, methods are disclosed herein for passivating the cleaved surface 152 of the SOI wafer 150 by exposure to a passivating substance such that the cleaved surface will not react with contaminants. Generally, the passivating substances used in the methods described herein include an oxidizing substance that grows and/or forms a thin oxide layer on the cleaved surface 152 of the SOI wafer 150 when exposed thereto. The passivation performed on the cleaved surface 152 results in the relatively easy removal of any contaminants that are later deposited on the cleaved surface. The cleaved surface 152 of the SOI wafer 150 is also passivated in-situ after the wafer is cleaved. That is, the SOI wafer 150 is passivated while it is in the chamber 170 and before it is removed from the chamber. No intermediate or other steps are performed between cleaving and passivation.

The SOI wafer 150 is thus not exposed to the outside atmosphere surrounding the chamber 170 before being passivated. Accordingly, the highly reactive cleaved surface of the SOI wafer is not exposed to contaminants before being passivated and is only exposed to the controlled, inert atmosphere within the chamber 170. As described above, in some embodiments an inert atmosphere is not used within the chamber 170 and instead a gas or other substance (broadly, a "passivating substance") is present in the chamber that passivates the surface of the wafer while or immediately after the wafer is cleaved. The wafer can thus be cleaved in a passivating environment, rather than an inert environment.

In other embodiments, the SOI wafer 150 may be transferred from the chamber 170 to an adjoining chamber 180 (broadly, a "second chamber"), where it is then passivated. This adjoining chamber 180 is disposed adjacent the chamber 170 and both of the chambers are configured such that the SOI wafer 150 can be transferred from the chamber to the adjoining chamber without exposing the SOI wafer to the outside atmosphere, and the contaminants contained therein, surrounding the chambers.

Moreover, the surfaces of other layered silicon structures (e.g., direct silicon-bonded structures that use a non-oxidized donor wafer) are also susceptible to the same types of contamination as the cleaved surface 152 of the SOI wafer 150. Accordingly, the methods described herein for performing passivation processes upon the cleaved surface 152 of the SOI wafer 150 can be used on the surfaces of layered silicon structures as well.

Figure 8:
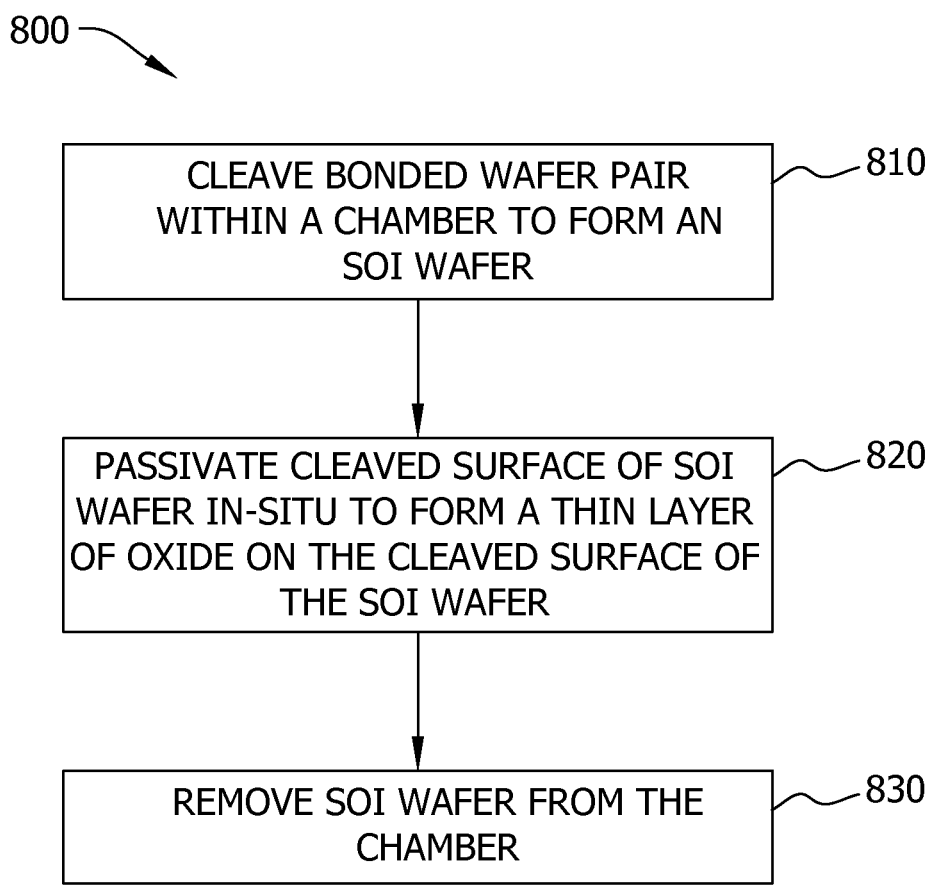
FIG. 8 is a flow diagram showing a method of performing a passivation process on an SOI wafer in a chamber in which the SOI wafer is formed.

FIG. 8 depicts a method 800 for performing a passivation process on an SOI wafer, such as the SOI wafer 150 described above in relation to FIGS. 1-7. The method 800 begins in block 810 with cleaving a bonded wafer pair within a chamber (i.e., the chamber 170) to form an SOI wafer. The cleaved surface of the SOI wafer is then passivated in-situ (i.e., while still in the chamber) in block 820. The cleaved surface of the SOI wafer may be passivated by exposing it to a gaseous form of ozone. The ozone may be introduced into the chamber after the bonded wafer pair has been cleaved, or the ozone may be present in the chamber while the bonded wafer pair is cleaved. A thin layer of oxide is formed on the cleaved surface because of the exposure of the cleaved surface to the gaseous ozone. This thin layer of oxide prevents the cleaved surface from reacting with contaminants. Contaminants that are later deposited on the cleaved surface are also more easily removed therefrom because they are prevented from reacting or bonding to the cleaved surface by the thin layer of oxide.

In other embodiments, the cleaved surface of the SOI wafer is passivated by exposure to ultraviolet light which generates gaseous ozone. A thin layer of oxide is formed on the cleaved surface during exposure of the cleaved surface to ultraviolet light. Moreover, in other embodiments the cleaved surface of the SOI wafer is passivated by exposure to an oxidizing glow discharge plasma process.

Figure 9:
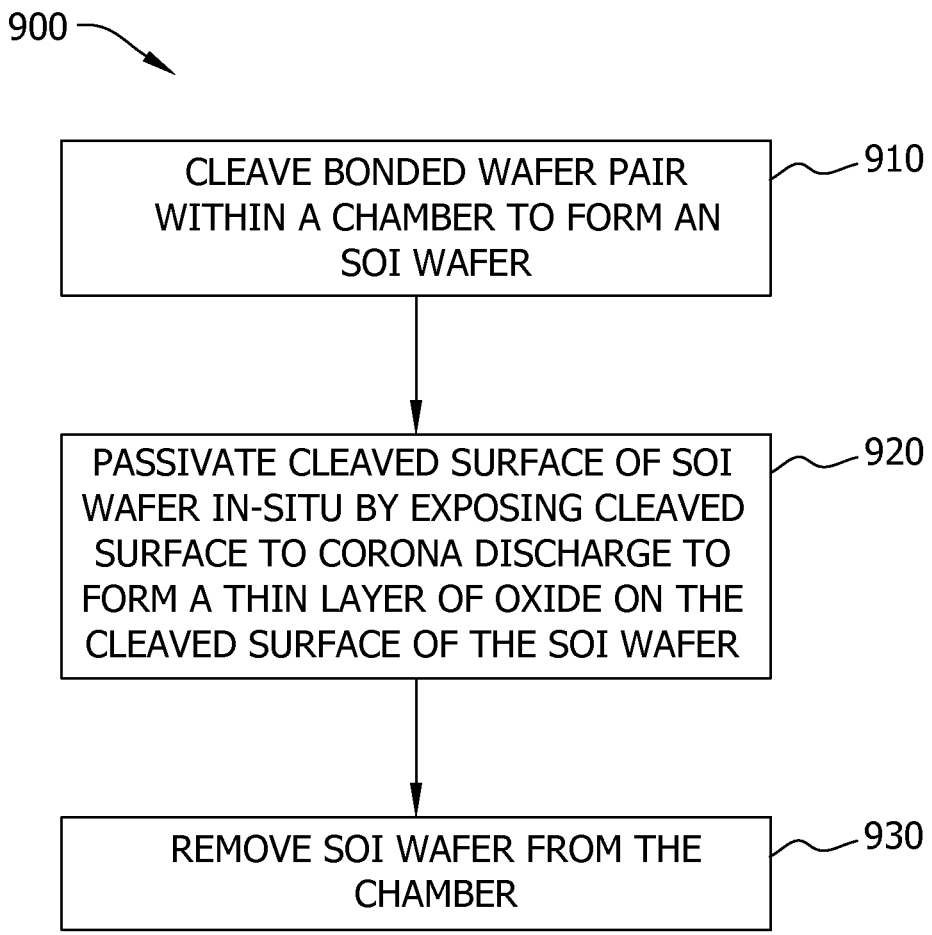
FIG. 9 is a flow diagram showing another method of performing a passivation process on an SOI wafer in a chamber in which the SOI wafer is formed.

FIG. 9 depicts a method 900 for performing a passivation process on an SOI wafer. The method 900 of FIG. 9 is similar to the method 800 described above, except that the method 900 uses a different process to passivate the cleaved surface of the SOI wafer. The method 900 begins in block 910 with cleaving a bonded wafer pair within a chamber to form an SOI wafer. The cleaved surface of the SOI wafer is then passivated in-situ (i.e., while still in the chamber) in block 920. The cleaved surface of the SOI wafer is passivated by exposing it to a corona discharge. The corona discharge is an electrical discharge that is initiated by the ionization of a fluid which surrounds a conductor. The electrical discharge occurs when the potential gradient (i.e., the strength of the electric field) exceeds a certain value for that fluid. The electrical discharge forms plasma around the conductor and the SOI wafer. Creation of the plasma in turn creates ozone and oxygen free radicals that react with the cleaved surface to form a thin layer of oxide on the cleaved surface of the SOI wafer. This thin layer of oxide prevents the cleaved surface from reacting with contaminants. Contaminants that are later deposited on the cleaved surface are also easily removed therefrom because they are prevented from reacting or bonding to the cleaved surface by the thin layer of oxide.

Figure 10:
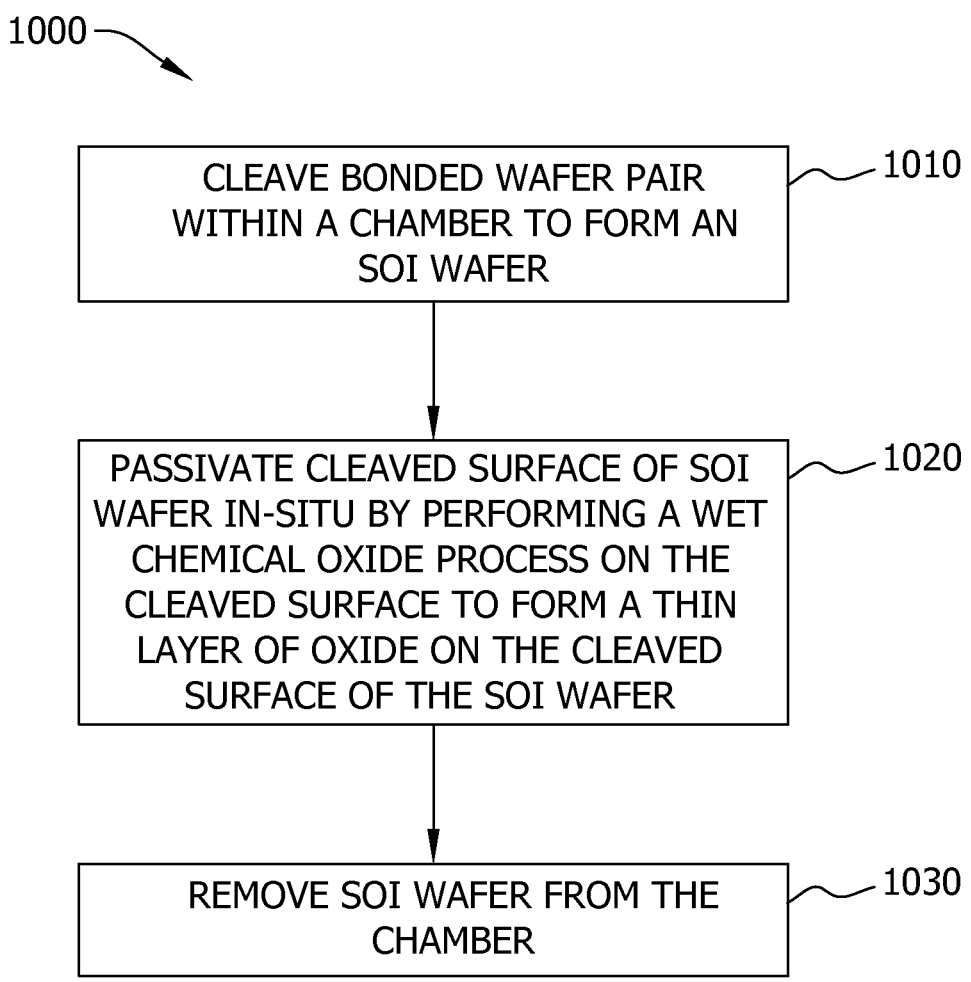
FIG. 10 is a flow diagram showing yet another method of performing a passivation process on an SOI wafer in a chamber in which the SOI wafer is formed.

FIG. 10 depicts a method 1000 for performing a passivation process on an SOI wafer that is similar to the methods 800, 900 described above, except that the method 1000 uses a different process to passivate the cleaved surface of the wafer. The method 1000 begins in block 1010 where a bonded wafer pair is cleaved to form an SOI wafer. The cleaved surface of the SOI wafer is then passivated in-situ in block 1020. The cleaved surface of the SOI wafer is passivated by performing a wet chemical oxide process on the cleaved surface. The wet chemical oxide process results in the formation of a thin layer of oxide on the cleaved surface that prevents the cleaved surface from reacting with contaminants that it contacts. Moreover, contaminants that are later deposited on the cleaved surface are easily removed therefrom because the contaminants are prevented from reacting or bonding to the cleaved by the thin layer of oxide.

In other embodiments, the cleaved surface of the SOI wafer is passivated by exposure to a wet chemical including one of ozonated water and hydrogen peroxide. Other examples of wet chemical etching compositions include compositions referred to as Standard Clean 1 (i.e., ammonia hydroxide, peroxide, and water) and Standard Clean 2 (i.e. HCl and hydrogen peroxide).

Figure 11:
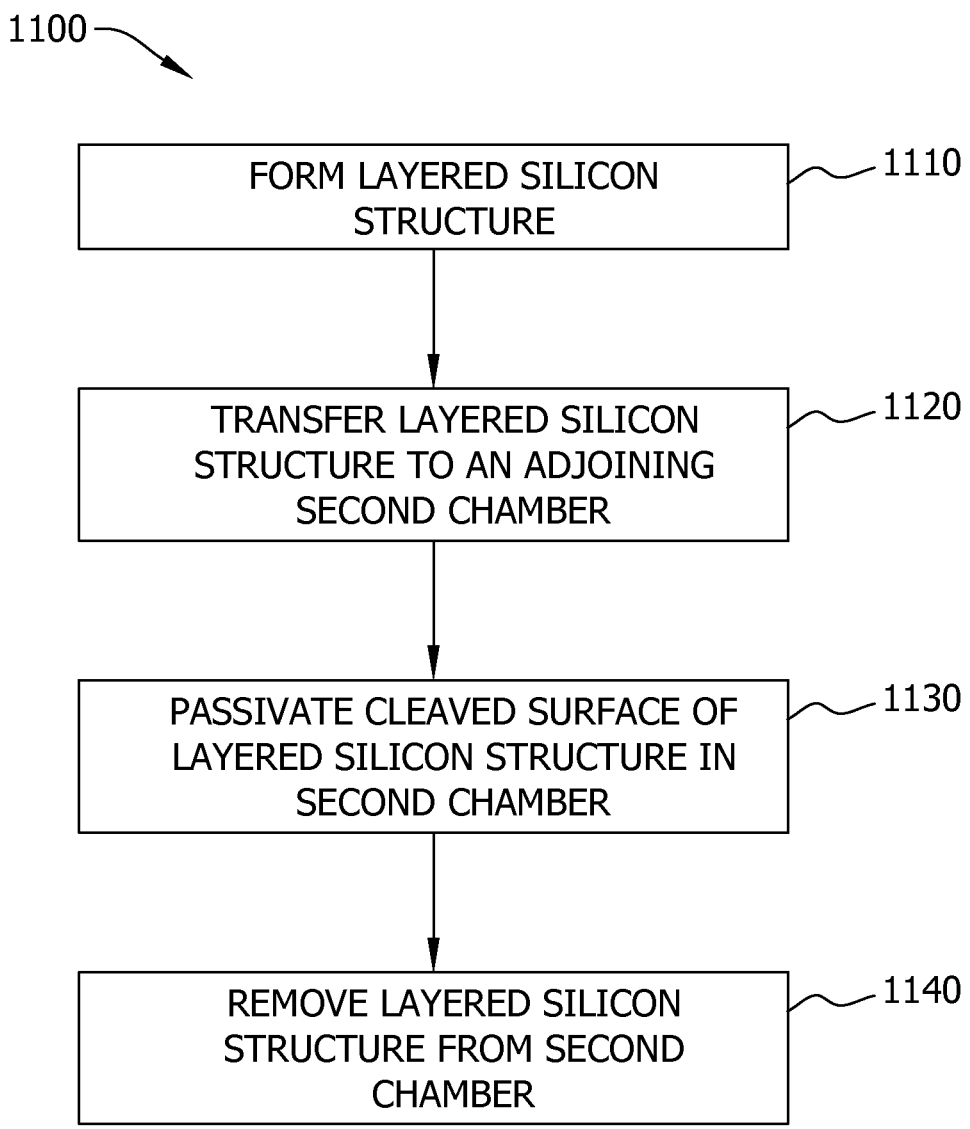
FIG. 11 is a flow diagram showing a method of performing a passivation process on a layered silicon structure in a chamber adjoining the chamber in which the layered silicon structure is formed.

FIG. 11 depicts a method 1100 for performing a passivation process on a layered silicon structure (e.g., an SOI wafer, or a direct silicon-bonded structure) that is similar to the methods 800, 900, 1000 described above, except that the passivation process is performed in a second chamber adjoining the chamber in which the layered silicon structure is formed. The method 1100 begins in block 1110 where the layered silicon structure is formed in a first chamber (e.g., the chamber 170). In block 1120, the layered silicon structure is transferred from the first chamber to an adjoining second chamber (e.g., the second chamber 180). The first chamber and the second chamber are each configured such that the layered silicon structure can be transferred therebetween without being exposed to the atmosphere outside of the chambers and the contaminants contained therein. Accordingly, a series of seals or other mechanisms may be disposed between the first chamber and the adjoining chamber in order to maintain the integrity between the two chambers. A mechanism (e.g., a trolley) or other suitable device may also be disposed within the chambers to transport the layered silicon structure from the first chamber to the second chamber.

In block 1130, the surface of the layered silicon structure is passivated in the second chamber. The passivation process used on the surface may be any of those described above in relation to FIGS. 8-10 and results in a thin layer of oxide being formed on the surface. The thin layer of oxide formed on the surface of the structure serves the same function as those described above in relation to FIGS. 8-10 in that it prevents the surface from reacting with or bonding to contaminants. The layered silicon structure is then removed from the second chamber in block 1140 after the passivation process is complete and the thin layer of oxide has been formed on the surface.

The order of execution or performance of the operations in embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions without departing from the scope of the invention, it is intended that all matter contained in the above description and shown in the accompanying drawings shall be interpreted as illustrative and not in a limiting sense.

What is claimed is:

1. A Method for performing a passivation process on a silicon-on-insulator wafer in a chamber, the method comprising the steps of:

cleaving a bonded wafer pair within the chamber to form the silicon-on-insulator (SOI) wafer, the SOI wafer having a cleaved surface;

passivating the cleaved surface of the SOI wafer in-situ by exposing the cleaved surface to a gaseous form of ozone, wherein exposing the cleaved surface to the gaseous form of ozone result in a thin layer of oxide on the cleaved surface and wherein the ozone is introduced into the chamber after the bonded wafer pair has been cleaved, and no intermediate steps are performed between cleaving and passivating; and removing the silicon-on-insulator wafer from the chamber.

2. The method of claim 1 wherein the thin layer of oxide formed on the cleaved surface of the silicon-on-insulator structure is formed to prevent contaminants from reacting with the cleaved surface.

3. The method of claim 1 wherein passivating the cleaved surface of the silicon-on-insulator wafer in-situ comprises passivating the cleaved surface in the chamber in which the bonded wafer pair is cleaved to form the silicon-on-insulator wafer.

4. The method of claim 3 further comprising forming the bonded wafer pair within the same chamber in which the bonded wafer is later cleaved.

5. The method of claim 1 wherein cleaving and separating the bonded wafer pair along a cleave plane is initiated and propagated by mechanical force.

* * * * *